United States Patent [19]

Kawanabe

[11] 4,254,379

[45] Mar. 3, 1981

[54] PUSH-PULL AMPLIFIER CIRCUIT

[75] Inventor: Yoshihiro Kawanabe, Tokyo, Japan

[73] Assignee: Pioneer Electronic Corporation, Tokyo, Japan

[21] Appl. No.: 12,421

[22] Filed: Feb. 15, 1979

[30] Foreign Application Priority Data

Feb. 17, 1978 [JP] Japan ................................ 53/17462

[51] Int. Cl.³ ............................................ H03F 3/30
[52] U.S. Cl. .................................. 330/268; 330/264; 330/265
[58] Field of Search .............. 330/264, 265, 267, 268, 330/269, 270, 273, 274, 298

[56] References Cited

U.S. PATENT DOCUMENTS

| 3,995,228 | 11/1976 | Pass .................................. 330/268 X |
| 4,121,168 | 10/1978 | Stitt ................................... 330/268 X |

Primary Examiner—James B. Mullins
Attorney, Agent, or Firm—Sughrue, Rothwell, Mion, Zinn and Macpeak

[57] ABSTRACT

A push-pull amplifier circuit comprises first and second output transistors whose emitters are commonly connected respectively through resistors to an output point, together with base biasing circuits connected between the bases of the first and second output transistors, to perform push-pull operation. The base biasing circuits comprise first and second current detecting elements for detecting the currents of the first and second output transistors, first and second variable bias generators controlled by the first and second current detecting element and reference bias generators. The operations of the first and second output transistors are effected in the active regions at all times.

8 Claims, 5 Drawing Figures

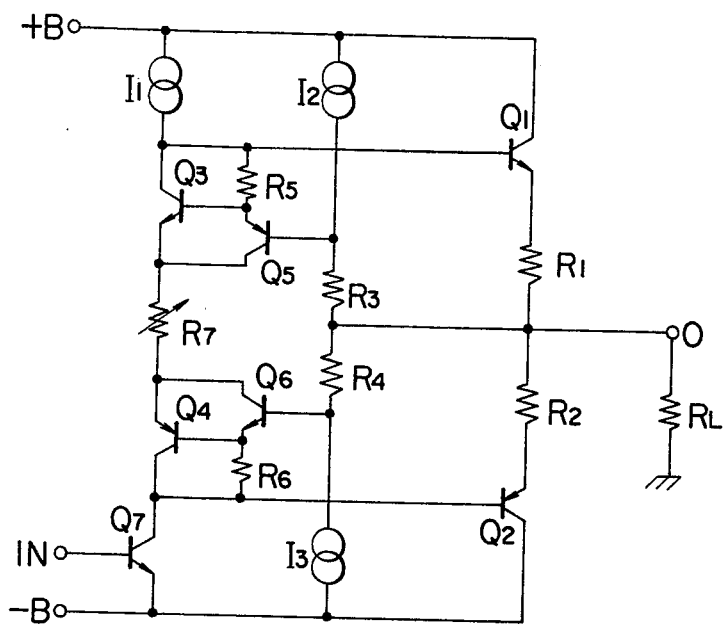
FIG. 1
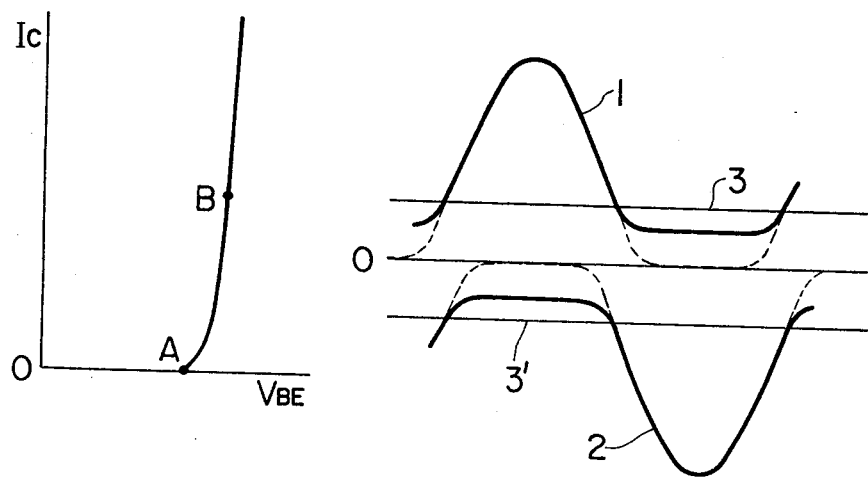
FIG. 2
FIG. 3

PUSH-PULL AMPLIFIER CIRCUIT

BACKGROUND OF THE INVENTION

This invention relates to a push-pull amplifier circuit which can be used as the power amplifier for audio equipment or the like.

A fundamental aspect of such an amplifier is a class "A" or class "B" complementary push-pull amplifier circuit. In the class "A" push-pull amplifier, the operations of a pair of output transistors are effected in the active regions at all times and are never shifted into the cut-off regions. Therefore, the class "A" push-pull amplifier is advantageous in that no switching distortion is caused, but it is still disadvantageous in that its thermal loss is increased because of the relatively large biasing current required. Conversely, the class "B" push-pull amplifier is advantageous in that the bias current is smaller to reduce the thermal loss. However, it is also disadvantageous in that switching distortion is caused because a pair of output transistors are operated by alternatively switching their operation states into the active state and the cut-off state.

SUMMARY OF THE INVENTION

Accordingly, a primary object of the present invention is to eliminate the above drawbacks in prior art amplifiers.

It is another object of the present invention to provide a push-pull amplifier circuit in which the difficulties accompanying a class "A" and a class "B" push-pull amplifier circuit are eliminated, the thermal loss is low, and no switching distortion is caused.

The foregoing objects of the present invention are accomplished by the provision of a push-pull amplifier circuit comprising first and second output transistors whose emitters are commonly connected respectively through resistors to an output point, and base biasing circuits connected between the bases of the first and second output transistors, to perform push-pull operation. The base biasing circuits comprise: first and second current detecting elements for detecting the currents of the first and second output transistors; first and second variable bias generators controlled by the first and second current detecting element; and reference bias generators. The operations of the first and second output transistors are effected in the active regions at all times.

The present invention will be described with reference to FIGS. 1 to 4.

BRIEF DESCRIPTION OF THE DRAWINGS

In the accompanying drawings,

FIG. 1 is a circuit diagram showing one embodiment of a push-pull amplifier circuit according to the present invention;

FIG. 2 is a graphical representation indicating a transistor operating characteristic curve;

FIG. 3 is also a graphical representation indicating output transistor current waveforms.

DETAILED DESCRIPTION OF THE PREFERRED EMBODIMENTS

Figure 4A:
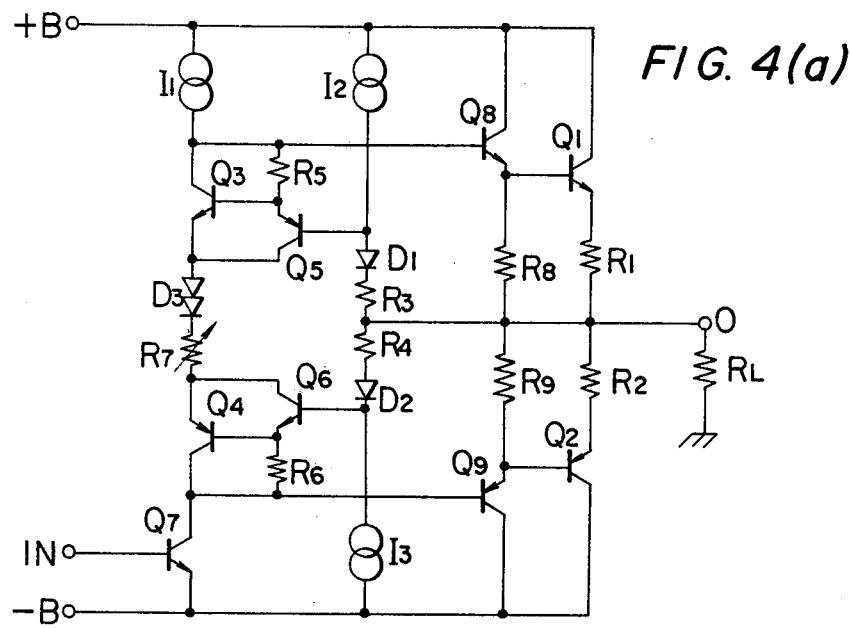
FIGS. 4(a) and 4(b) are circuit diagrams showing other embodiments of the push-pull amplifier according to the present invention.

Preferred embodiments of the present invention will now be described with reference to the accompanying drawings.

FIG. 1 shows a first embodiment of the present invention. An NPN output transistor $Q_1$ and a PNP output transistor $Q_2$ have their respective emitters connected respectively through resistors $R_1$ and $R_2$ to an output point 0 and a load $R_L$, such as a loudspeaker, is connected to the output point 0. The load $R_L$ is driven by an output amplified by the output transistors $Q_1$ and $Q_2$.

Connected between the bases of the two transistors $Q_1$ and $Q_2$ is a base bias circuit which comprises an NPN transistor $Q_3$, a voltage control resistor $R_7$ for providing a reference bias, and a PNP transistor $Q_4$ which are successively connected in the stated order. Current from a constant current source $I_1$ is supplied to the base bias circuit, and an input signal is applied thereto by an input transistor $Q_7$. The transistors $Q_3$ and $Q_4$ are variable bias generators. The collectors of the transistors $Q_3$ and $Q_4$ are connected to the bases of the transistors $Q_1$ and $Q_2$, respectively, and the emitters are connected to both terminals of the resistor $R_7$.

Transistors $Q_5$ and $Q_6$ are connected between transistors $Q_3$ and $Q_4$ and the transistors $Q_1$ and $Q_2$ and output point 0. More specifically, the emitter of the NPN transistor $Q_5$ is connected through a resistor $R_5$ to the base of the transistor $Q_1$ and to the base of the transistor $Q_3$. The collector of the transistor $Q_5$ is connected directly to the emitter of the transistor $Q_3$, and the base of the transistor $Q_5$ is connected through a resistor $R_3$ to the output point 0.

The emitter of the NPN transistor $Q_6$ is connected through a resistor $R_6$ to the base of the transistor $Q_2$ and to the base of the transistor $Q_4$, while the collector of the transistor $Q_6$ is connected to the emitter of the transistor $Q_4$. Furthermore, the base of the transistor $Q_6$ is connected through a resistor $R_4$ to the output point O. Currents from constant current sources $I_2$ and $I_3$ are fed to the resistors $R_3$ and $R_4$, respectively, so that constant voltages are supplied to the bases of the transistors $Q_5$ and $Q_6$ with respect to the output point 0.

The transistors $Q_5$ and $Q_6$ are set so that the operating points are at the point A in the operating characteristic curve shown in FIG. 2 when no signal is applied thereto (hereinafter referred to as a no-signal time when applicable). Therefore, at the no-signal time the collector currents of the transistors $Q_5$ and $Q_6$ are very small, and therefore voltage drops across the resistors $R_5$ and $R_6$ are also very small. Accordingly, the voltage between the bases of the transistors $Q_1$ and $Q_2$ is determined from the base-emitter voltages of the transistors $Q_3$ $Q_4$ and a voltage across the resistor $R_7$.

Thus, when a signal is applied through the input transistor $Q_7$ to allow the potential at the output point 0 to shift toward the positive side according to the input signal condition, a forward current flows in the output transistor $Q_1$. Therefore, the voltage between the base of the transistor $Q_1$ and the output point 0 is increased. This voltage increase is detected by the transistor $Q_5$, so that a collector current flows in the transistor $Q_5$. In this connection, with the sufficiently high current amplification factors of the transistors, a larger part of the current flowing in the resistor $R_5$ becomes the collector current of the transistor $Q_5$. The current in the resistor $R_7$ becomes equal to that at the no-signal time and the voltage between the collectors of the transistors $Q_5$ and $Q_4$ is maintained equal to that at the no-signal time.

Conversely, the operating point of the transistor $Q_5$ is shifted from point A to point B in the curve shown in FIG. 2. In this case, the variation of the base-emitter voltage is extremely small, and the base-collector voltage of the transistor $Q_5$ is substantially equal to that at the no-signal time. The current from the constant current source $I_2$ is supplied to the resistor $R_3$, and therefore the voltage drop across the resistor $R_3$ is maintained constant at all times. Thus, the base voltage of the output transistors $Q_1$ and $Q_2$ with respect to the output point 0 is maintained substantially equal to that at the no-signal time, and therefore the output transistor $Q_2$ is not cut off.

In the case also where the potential at the output point, is shifted toward the negative side according to the input signal condition, the output transistor $Q_1$ is not cut off similarly as in the above-described case.

Accordingly, the current of the output transistor $Q_1$ having the characteristic curve 1 in FIG. 3 and the current of the output transistor $Q_2$ having the characteristic curve 2 are never at the zero level as indicated by the solid lines, and the transistors operate in the active regions. Furthermore, during the no-signal time, the idle current much smaller than the idle current of the class "A" push-pull amplifier circuit can be allowed to flow therein. The dotted lines in FIG. 3 represent the current waveforms of a conventional class "B" push-pull amplifier circuit. It can be readily understood that the currents of both output transistors are at the zero level for some time portions, and the output transistors are alternately cut off. The curves 3 and 3' are idle current waveforms during the no-signal time.

Figure 4B:
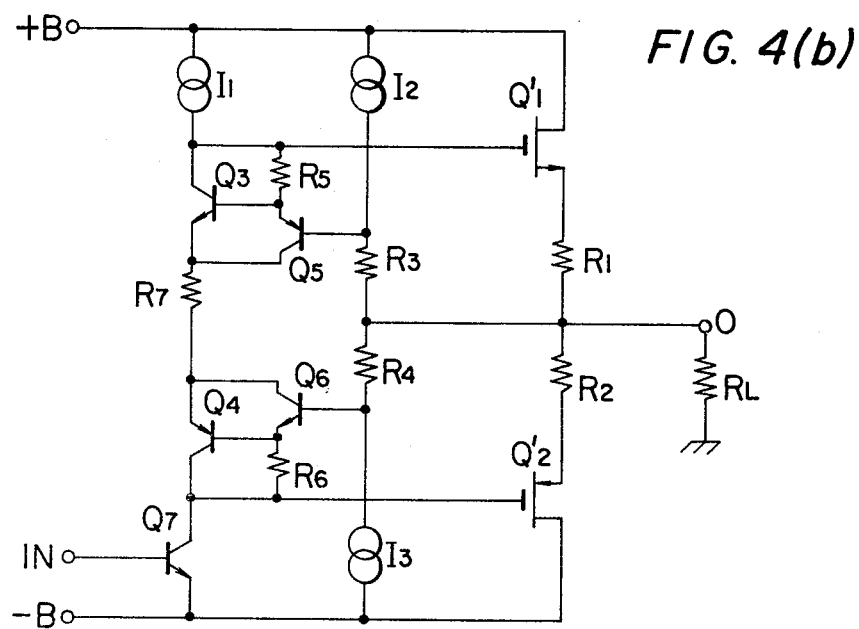

FIG. 4(a) and 4(b) show second and third embodiments of the present invention, respectively. The push-pull amplifier circuit shown in FIG. 4(a) is obtained by modifying the first embodiment shown in FIG. 1 to a more commercially usable status. In this embodiment, a diode $D_3$ for providing a constant voltage is additionally connected between the emitter of the transistors $Q_3$ and $Q_4$, and diodes $D_1$ and $D_2$ for providing constant voltages are additionally provided between the bases of the transistors $Q_5$ and $Q_6$ and the output point 0. Transistors $Q_8$ and $Q_9$ and resistors $R_8$ and $R_9$ are connected to the output transistors $Q_1$ and $Q_2$ to form a Darlington arrangement, respectively.

In FIG. 4(b) which shows the third embodiment, an N channel field-effect transistor $Q_1'$ is used instead of the NPN output transistor $Q_1$ in FIG. 1, and a P channel field-effect transistor $Q_2'$ is employed instead of the PNP output transistor $Q_2$. The push-pull amplifier circuit operates in the same manner.

As is apparent from the above description, according to the present invention, the operation of the output transistors $Q_1$ and $Q_2$ are effectuated in the active regions at all times, and are never shifted to the cut-off regions. Accordingly, in the push-pull amplifier circuit according to the present invention, no switching distortion which may occur in the class "B" push-pull amplifier results. Furthermore, the biasing currents can be made smaller than those in the class "A" push-pull amplifier circuit, which leads to a reduction in thermal loss. It should be noted that modifications of the present invention to all of the output amplifier circuits are possible without departing from the essential concepts of the present invention.

What is claimed:

1. In a push-pull amplifier circuit having first and second output transistors whose emitters are commonly connected respectively through first and second resistors to an output point, and base biasing circuits connected between the bases of said first and second output transistors, the improvement comprising said base biasing circuit comprises: first and second current detecting elements coupled to and detecting the currents of said first and second output transistors, said first current detecting element comprising a third transistor the emitter of which is connected through a third resistor to the base of said first output transistor and the base of which is connected to first means for generating a constant voltage with respect to said output point, and said second current detecting element comprises a fourth transistor the emitter of which is connected through a fourth resistor to the base of said second output transistor and the base of which is connected to second means for generating a constant voltage with respect to said output point; first and second variable bias generating means coupled to and controlled by said first and second current detecting elements; and reference bias generating means coupled to said output transistors and current detecting elements.

2. A push-pull amplifier circuit as defined in claim 1, wherein said first variable bias generating means comprises a fifth transistor the collector of which is connected to the base of said first output transistor and the base of which is connected to the emitter of a third transistor forming said first current detecting element, and said second variable bias generating means comprises a sixth transistor the collector of which is connected to the base of said second output transistor and the base of which is connected to the emitter of a fourth transistor forming said second current detecting element.

3. The push-pull amplifier circuit of claim 1 wherein said first and second transistors are NPN and PNP types respectively.

4. The push-pull amplifier circuit of claim 1 wherein said first and second transistors are N channel and P channel field effect transistors respectively.

5. The push-pull amplifier circuit of claim 2 wherein said reference bias generating means comprises a voltage control resistor interposed between the emitters of the transistors forming the first and second variable bias generating means.

6. The push-pull amplifier circuit of claims 2 or 5 further comprising first diode means interposed between the emitters of the transistors forming the first and second variable bias generating means.

7. The push-pull amplifier circuit of claim 6 further comprising second diode means interposed between the bases of the transistors forming the first and second circuit detecting elements.

8. The push-pull amplifier of claim 7 further comprising seventh and eighth transistor means having emitters respectively coupled to the bases of said first and second output transistors to form a Darlington arrangement.

* * * * *